(12) United States Patent
Koezuka et al.

(10) Patent No.: US 7,713,761 B2
(45) Date of Patent: May 11, 2010

(54) DOPING APPARATUS, DOPING METHOD, AND METHOD FOR FABRICATING THIN FILM TRANSISTOR

(75) Inventors: Junichi Koezuka, Kanagawa (JP); Naoto Yamade, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 309 days.

(21) Appl. No.: 11/798,980

(22) Filed: May 18, 2007

(65) Prior Publication Data

US 2007/0224711 A1 Sep. 27, 2007

Related U.S. Application Data

(62) Division of application No. 10/910,623, filed on Aug. 4, 2004, now Pat. No. 7,250,312.

(30) Foreign Application Priority Data

Aug. 8, 2003 (JP) .............................. 2003-290795

(51) Int. Cl.
  *G01R 31/26* (2006.01)
  *H01L 21/66* (2006.01)
(52) U.S. Cl. .................... 438/14; 438/252; 438/514; 438/914; 257/E21.529; 257/E21.521; 257/E29.002; 257/E21.147; 257/E21.343; 257/E21.043
(58) Field of Classification Search .................. 438/14, 438/514, 252, 914; 257/E21.529, E21.521, 257/E29.002, E21.147, E21.343, E21.043
See application file for complete search history.

(56) References Cited

U.S. PATENT DOCUMENTS 5,650,335 A    7/1997  Terazono 6,699,330 B1 *  3/2004  Muraoka ..................... 134/3
6,778,282 B1    8/2004  Smets et al.
7,158,896 B1 *  1/2007  Singh et al. .................. 702/31
7,250,312 B2 *  7/2007  Koezuka et al. .............. 438/14
7,426,067 B1 *  9/2008  Bright et al. .............. 359/223.1
2003/0017658 A1  1/2003  Nishitani et al.

FOREIGN PATENT DOCUMENTS

JP    H11-23498    1/1999

OTHER PUBLICATIONS

Yasuhiro Sato et al., "Study of HF-Treated Heavily-Doped Si Surface Using Contact Angle Measurements", Japanese Journal of Applied Physics, vol. 33, Part 1, No. 12A, Dec. 1994, pp. 6508-6513.
Chinese Office Action (Application No. 200410056427.X; CN07305), dated Nov. 6, 2009, with English translation.

* cited by examiner

*Primary Examiner*—Michelle Estrada
(74) *Attorney, Agent, or Firm*—Nixon Peabody LLP; Jeffrey L. Costellia

(57) ABSTRACT

It is an object of the present invention to provide a doping apparatus, a doping method, and a method for fabricating a thin film transistor that can carry out doping to the carrier concentration which is optimum for obtaining the desired electric characteristic non-destructively and in an easy manner. In accordance with the present invention, an electric characteristic of a semiconductor element (threshold voltage in a transistor and the like) is correctly and precisely monitored by using a contact angle, and is controlled by controlling a doping method. In addition, the present invention can be momentarily acquired information by in-situ monitoring the characteristic and can be fed back without a time lag.

19 Claims, 9 Drawing Sheets

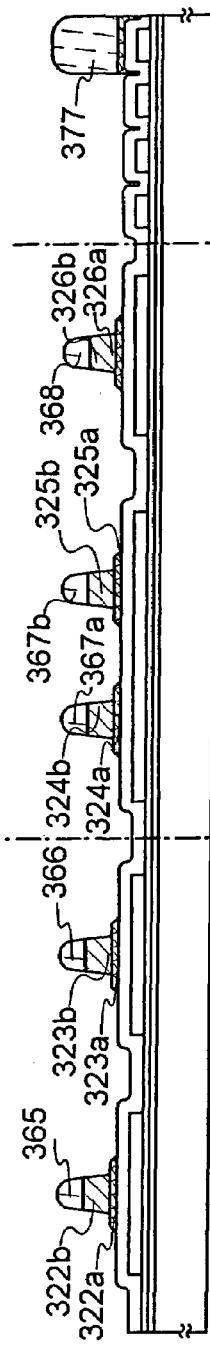
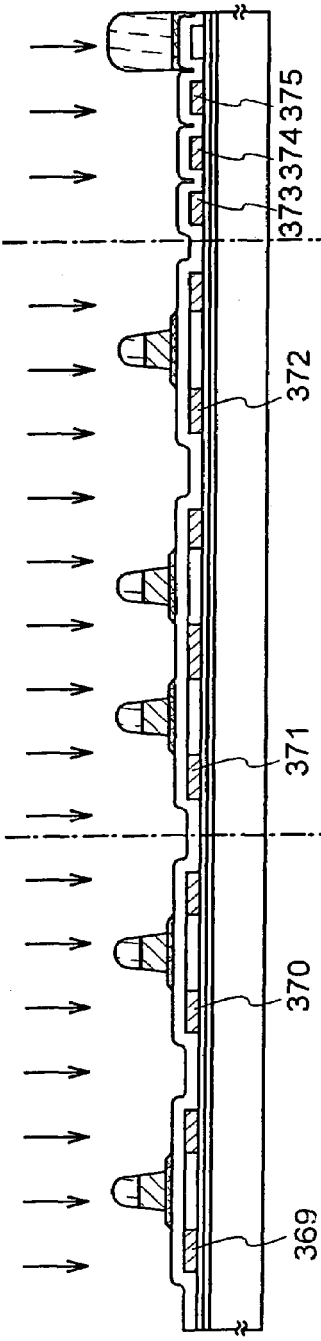
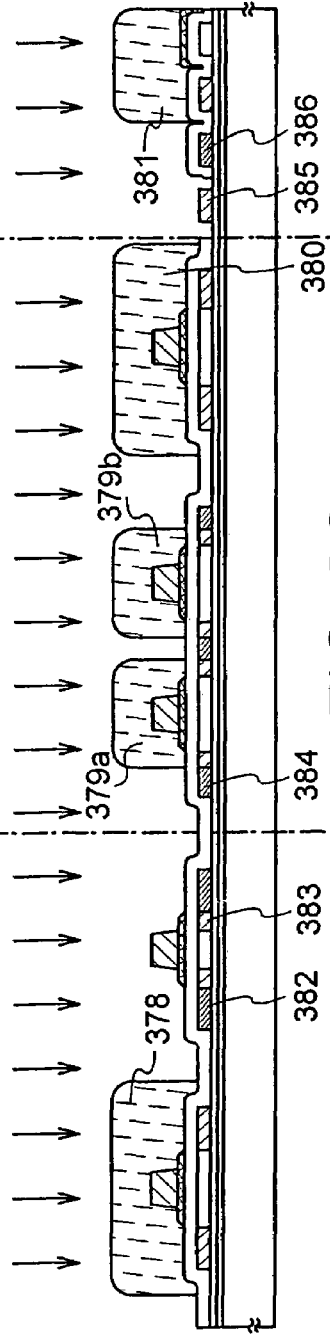
FIG. 5A
FIG. 5B
FIG. 5C

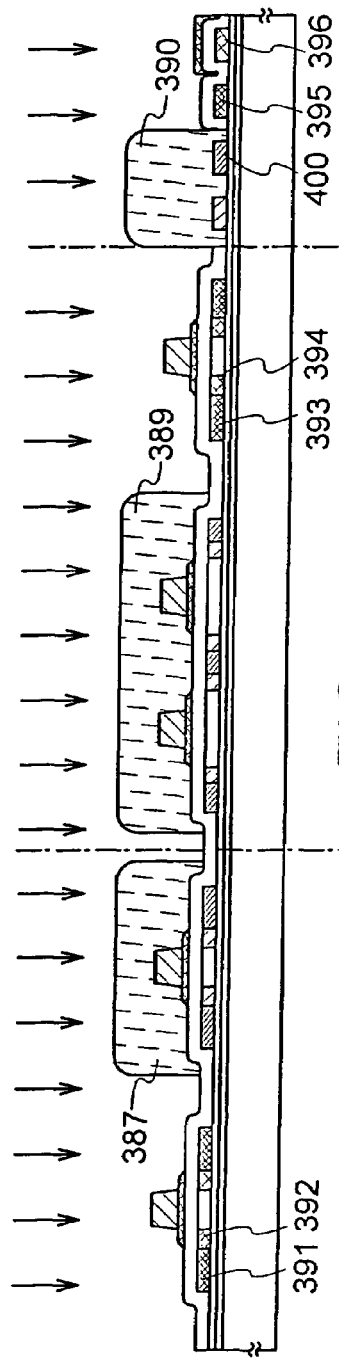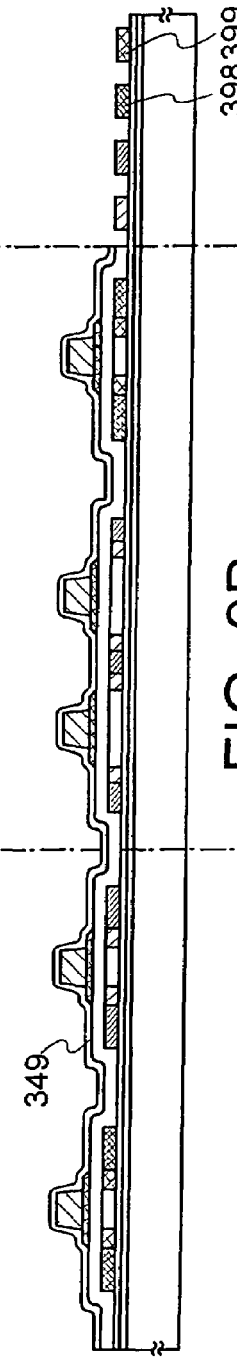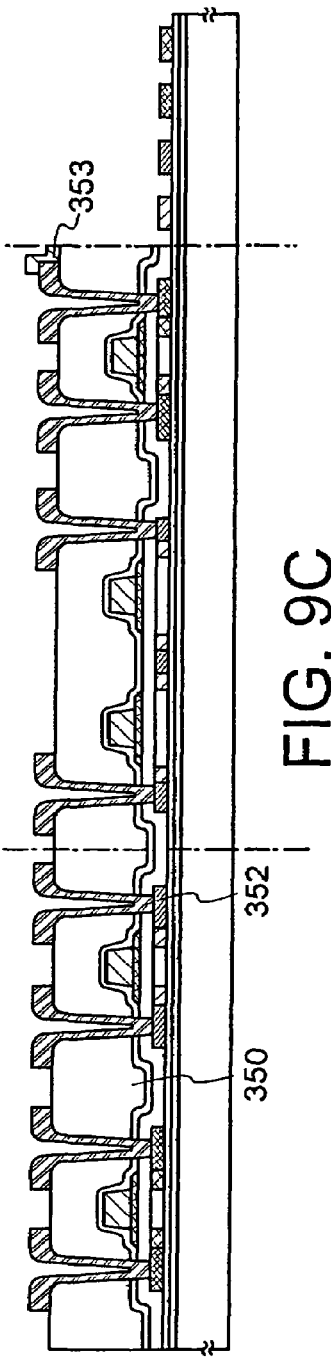

DOPING APPARATUS, DOPING METHOD, AND METHOD FOR FABRICATING THIN FILM TRANSISTOR

This application is a Divisional of application Ser. No. 10/910,623 filed Aug. 4, 2004 now U.S. Pat. No. 7,250,312, now Allowed.

BACKGROUND OF THE INVENTION

1. Field of the Invention

The present invention relates to a doping apparatus and a doping method, more specifically to doping technology used for forming a dopant region such as source and drain regions in a field-effect transistor (FET).

2. Description of the Related Art

In semiconductor elements (devices) such as a field-effect transistor and a thin-film transistor, doping is carried out to control their electric characteristics. The doping is a method for introducing a dopant such as arsenic (As), boron (B), and phosphorus (P) into a semiconductor film. Depending on the type of the dopant introduced into the semiconductor element, the semiconductor elements can be obtained p type in which holes are the majority carrier and n type in which electrons are the majority carrier. Therefore, electric characteristics of semiconductor elements (for example, a threshold voltage in thin-film transistors) have been controlled by the amount of dopant (dosage) which is doped, activation ratio of the dopant, and carrier concentration.

The activation ratio of a dopant is represented by the ratio of the amount of a dopant introduced in a semiconductor film and the amount of actually activated dopant. The activated dopant generates carriers. When the activation ratio of a dopant is 100%, the concentration of a dopant becomes equal to the concentration of carriers.

Characteristics of the elements have been conventionally inspected upon completion of semiconductor element fabrication. This information is fed back to a fabrication process and the doping method such as the amount of a dopant and doping rate is adjusted.

On the other hand, secondary ion mass spectroscopy (SIMS), spread resistance method (SR), and the like are used as methods for measuring the aforementioned dopant concentration (for example, see Patent Document 1).

[Patent Document 1]

Japanese Patent Laid-Open No. H11-23498

SUMMARY OF THE INVENTION

However, secondary ion mass spectroscopy (SIMS) and spread resistance method (SR) are destructive inspections and are not suitable for conducting measurements on the substrates in a real production line. Furthermore, the concentration that can be measured with secondary ion mass spectroscopy (SIMS) is the concentration of the introduced dopant and this method cannot measure the accurate concentration of carriers. Further, the spread resistance method (SR) cannot clarify the conductivity type of the carriers.

Further, if those methods are used for measuring the electric characteristics of a FET, conducting the feedback upon completion of the entire process causes poor efficiency and a time delay (time lag), which results in inaccurate information.

It is an object of the present invention to provide a doping apparatus and a doping method that can carry out doping to the carrier concentration which is optimum for obtaining the desired electric characteristics non-destructively and in an easy manner. In addition, it is another object of the present invention is to momentarily acquire information by in-situ monitoring the characteristics and to enable the doping without a time lag.

In accordance with the present invention, characteristics of a semiconductor element (threshold voltage in a transistor and the like) are correctly and precisely monitored by using a contact angle. A contact angle also corresponds to slight changes in the electric characteristics of a semiconductor.

A contact angle, as represented by Formula 1, depends on the surface tension (surface free energy) of a substance.

$$\gamma_S = \gamma_L \cos\theta + \gamma_{SL} \qquad \text{[Formula 1]}$$

In Formula 1, $\gamma_S$ is the surface tension of a solid, $\gamma_L$ is the surface tension of a liquid, $\theta$ is a contact angle (liquid wetting angle), $\gamma_{SL}$ is the interface tension between the solid and the liquid. The smaller is the contact angle, the better is wetting with the liquid. For example, if the liquid is water, the smaller is the contact angle of water, the more hydrophilic is the solid surface and the increase in the contact angle is considered as hydrophobicity. Formula 1 demonstrates that for the same liquid, the contact angle is increased and the surface is less wetted, and the so-called wettability is degraded as the surface tension of the solid decreases.

In accordance with the present invention, the electric characteristics of a semiconductor element (threshold voltage in a transistor and the like) are correctly and precisely monitored by using a contact angle, and the characteristics are controlled by controlling the doping method.

One of the doping apparatuses in accordance with the present invention comprises means for doping a dopant element providing one conductivity type into a semiconductor layer, means for measuring a contact angle of the surface of the semiconductor layer, means for judging the conductivity type and carrier concentration of the semiconductor layer from the measured contact angle, and means for feeding back the amount of the dopant element providing one conductivity type that should be doped into the semiconductor layer to the means for doping based on the judgment results.

One of the doping apparatuses in accordance with the present invention comprises means for doping a dopant element providing one conductivity type into a semiconductor layer, means for cleaning the surface of the semiconductor layer, means for measuring a contact angle of the surface of the semiconductor layer, means for judging the conductivity type and carrier concentration of the semiconductor layer by the measured contact angle, and means for feeding back the amount of the dopant element providing one conductivity type that should be doped into the semiconductor layer to the means for doping based on the judgment results.

In the above-described structure, means for cleaning the surface of the semiconductor layer is means for chemically removing an oxide film and the like which is formed in the course of time on the surface of the semiconductor layer in order to measure the correct contact angle of the semiconductor surface. The oxide film may be removed by spin applying an aqueous solution containing hydrofluoric acid and etching.

The contact angle may be measured with a liquid allowing for precise measurements on the semiconductor film. For example, the carrier concentration and conductivity type of the semiconductor layer can be estimated by using water and measuring the contact angle of water on the semiconductor film surface. A Dopant such as arsenic (As), boron (B), or phosphorus is activated and becomes a carrier. The carrier concentration in the semiconductor layer and the conductivity type thereof are analyzed and judged by using a contact angle as a sensor, and the characteristics of the semiconductor (threshold voltage of a transistor and the like) using this semiconductor layer are analyzed. The information obtained is fed back to the means for doping the dopant element providing one conductivity type and doping of the dopant element providing one conductivity type is carried out so that the electric characteristics of the semiconductor element which are assessed by a contact angle assume the appropriate values.

One doping method in accordance with the present invention comprises the steps of judging the conductivity type and carrier concentration of a semiconductor layer and determining the amount of a dopant of one conductivity type that should be doped into the semiconductor layer by measuring a contact angle of the surface of the semiconductor layer.

One doping method in accordance with the present invention comprises the steps of exposing the surface of a semiconductor layer, and judging the conductivity type and carrier concentration of the semiconductor layer and determining the amount of a dopant of one conductivity type that should be doped into the semiconductor layer by measuring a contact angle of the surface of the semiconductor layer.

One doping method in accordance with the present invention comprises the steps of exposing the surface of a semiconductor layer, judging the conductivity type and carrier concentration of the semiconductor layer, determining the amount of a dopant of one conductivity type that should be doped into the semiconductor layer by measuring a contact angle of the surface of the semiconductor layer, and controlling the threshold voltage of a transistor.

In the above-described configuration, a contact angle of the surface of the semiconductor layer may be measured after chemically removing an oxide film and the like formed in the course of time on the surface of the semiconductor layer in order to measure the correct contact angle of the semiconductor surface. The oxide film may be removed by spin applying an aqueous solution containing hydrofluoric acid and etching.

A contact angle may be measured with a liquid allowing for precise measurements on the semiconductor film. For example, at least one of the carrier concentration and the conductivity type of the semiconductor layer can be estimated by using water and measuring a contact angle of water on the semiconductor film surface. A dopant such as arsenic (As), boron (B), or phosphorus (P) is activated and becomes a carrier. The carrier concentration in the semiconductor layer and the conductivity type thereof are judged by using a contact angle as a sensor, and the electric characteristics of the semiconductor (threshold voltage of a thin film transistor) using this semiconductor layer are analyzed. The doping conditions are determined and fed back to the doping process so that the electric characteristics of the semiconductor (threshold voltage of a thin film transistor) which are assessed by a contact angle assume the appropriate values. If necessary, the doping conditions are controlled and doping into the semiconductor layer is conducted. The doping process is carried out, while the information is fed back, till the carrier concentration and conductivity type thereof are optimized. The semiconductor layer in which the optimum carrier concentration and conductivity type have been attained is advanced to subsequent processing.

One method for fabricating a thin film transistor in accordance with the present invention comprises the steps of exposing the surface of a semiconductor layer, measuring a contact angle at the surface of the semiconductor layer, judging the conductivity type and carrier concentration of the semiconductor layer from the measured contact angle, determining the amount of a dopant element providing one conductivity type that should be doped into the semiconductor layer based on the judgment results, and then doping the dopant element providing one conductivity type into the semiconductor layer.

One method for fabricating a thin film transistor in accordance with the present invention comprises the steps of exposing the surface of a semiconductor layer, measuring a contact angle at the surface of the semiconductor layer, judging the conductivity type and carrier concentration of the semiconductor layer from the measured contact angle, determining the dose quantity of a dopant element providing one conductivity type aimed at controlling the threshold voltage of a transistor in the semiconductor layer based on the judgment results, and then doping the dopant element providing one conductivity type into the semiconductor layer.

In the above-described configuration, a contact angle of the surface of the semiconductor layer may be measured after chemically removing an oxide film and the like formed in the course of time on the surface of the semiconductor layer in order to measure the correct contact angle of the semiconductor surface. The oxide film may be removed by spin applying an aqueous solution containing hydrofluoric acid and etching.

A contact angle may be measured with a liquid allowing for precise measurements on the semiconductor film. For example, the carrier concentration and conductivity type of the semiconductor layer can be estimated by using water and measuring a contact angle of water on the semiconductor film surface. A dopant such as arsenic (As), boron (B), or phosphorus (P) is activated and becomes a carrier. The carrier concentration in the semiconductor layer and the conductivity type thereof are judged by using a contact angle as a sensor, and the electric characteristics of the semiconductor (threshold voltage of a thin film transistor) using this semiconductor layer are analyzed. The doping conditions are determined and fed back to the doping process so that the electric characteristics of the semiconductor (threshold voltage of a thin film transistor) which are assessed by a contact angle assume the appropriate values. If necessary, the doping conditions are controlled and doping into the semiconductor layer is conducted. The doping process is carried out, while the information is fed back, till the carrier concentration and conductivity type thereof are optimized. The semiconductor layer in which the optimum carrier concentration and conductivity type have been attained is advanced to subsequent processing.

In accordance with the present invention, the characteristics of a semiconductor can be measured non-destructively and in an easy manner, and the optimum carrier concentration and conductivity type thereof can be obtained by feeding back the information. Because of the non-destructive inspection and simple manner, in-situ measurements of actual substrates are possible. Because monitoring can be conducted on actual substrates, inaccuracy of measurements is extremely small.

Further, the characteristics of the semiconductor can be momentarily and accurately comprehended non-destructively and in an easy manner by in-situ monitoring the characteristics, and doping can be conducted under optimum conditions allowing the desired characteristics to be obtained by feeding back this information to the process. Therefore, there is no time lag in the feedback and the yield is increased.

In accordance with the present invention, the characteristics of a semiconductor can be measured non-destructively and in an easy manner, and the optimum doping conditions can be determined by feeding back the information. Because of the non-destructive inspection and simple manner, in-situ measurements of substrates in an actual production line are possible. Because monitoring can be conducted on the substrates, inaccuracy of measurements is extremely small. Furthermore, the activation ratio of a dopant in the semiconductor, which is a factor relating to actual electric characteristics, can be accurately measured and the conductivity type of a dopant can be distinguished.

The present invention can provide a doping apparatus and a doping method with which the characteristics of a semiconductor can be momentarily and accurately comprehended non-destructively and in an easy manner by in-situ monitoring the characteristics, and doping can be conducted under optimum conditions allowing the desired characteristics to be obtained by feeding back this information to the process. The present invention can also provide a method for the fabrication of a thin film transistor using the doping apparatus and the doping method.

BRIEF DESCRIPTION OF THE DRAWINGS

FIGS. 5A to 5C are cross-sectional views showing a fabricating process of an active matrix substrate.

FIGS. 9A to 9C are cross-sectional views showing a fabricating process of an active matrix substrate.

DETAILED DESCRIPTION OF THE INVENTION

Embodiment Mode

Embodiment modes of the present invention will be described with reference to the accompanying drawings. Note that the present invention can be implemented in various modes, and it is understood easily by those skilled in the art that embodiment modes and details of the invention can be variously changed without departing from the spirit and scope of the invention. Therefore, the present invention is not construed with a limitation on the contents of the embodiment modes.

Figure 1:
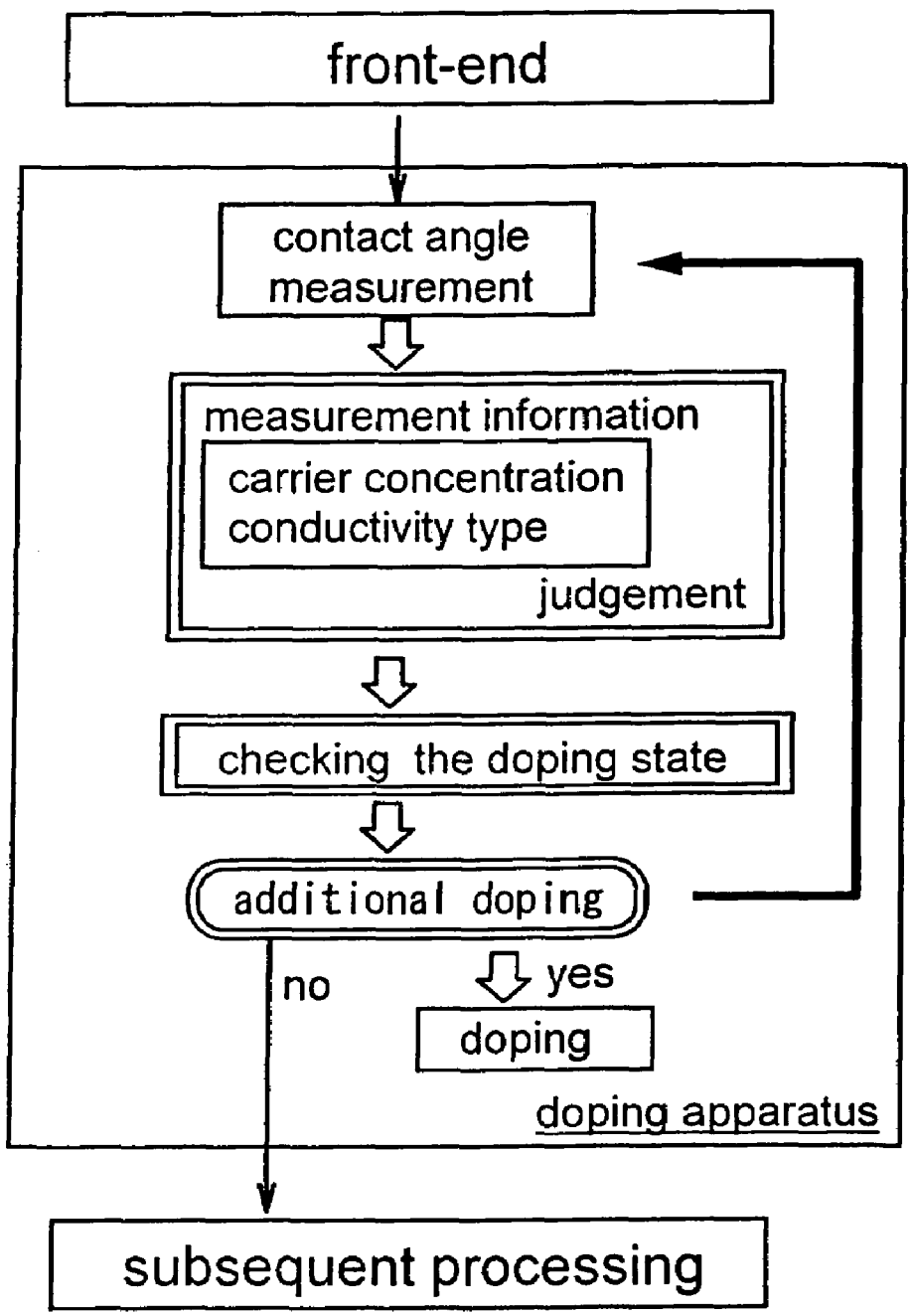
FIG. 1 is a diagram showing a configuration of the present invention.

FIG. 1 is a flow chart illustrating the present invention. First, a contact angle at the surface of a semiconductor layer is measured through the preprocessing and up to a doping process and the characteristics of the semiconductor layer are studied. The carrier concentration and conductivity type are judged by the measured information.

The measured information is checked up with the conditions which are optimum for obtaining the desired characteristics and the carrier concentration and conductivity type thereof are verified. Based on the verification results, the additional doping is carried out, if necessary, and the semiconductor film with the optimized carrier concentration and conductivity type thereof is advanced to subsequent processing.

Figure 2:
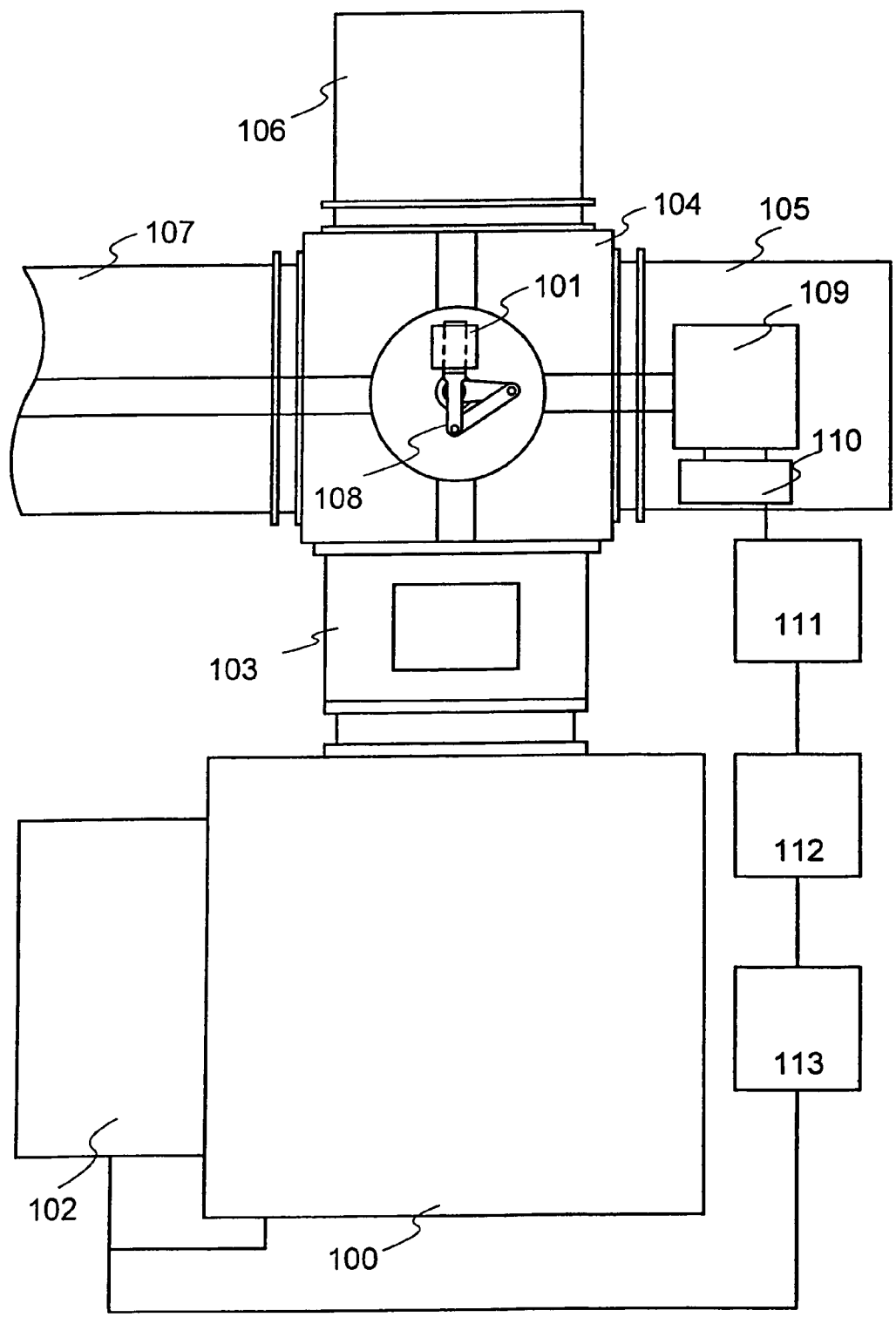
FIG. 2 is a diagram showing a configuration of the present invention.

A doping apparatus in accordance with the present invention is shown in FIG. 2. The reference numeral 100 stands for a doping chamber, 101—a semiconductor film, 102—an ion source, 103—a delivery chamber, 104—a transportation chamber, 105—a contact angle measurement chamber, 106—a processing chamber, 107—a load/unload chamber, 108—a transportation unit, 109—a contact angle measurement device, 110—a medium for loading the measurement information, 111—an analytical unit, 112—a control unit, and 113—a control unit of a doping apparatus.

The semiconductor film 101 that was introduced into the transportation chamber 104 from the load/unload chamber 107 is again transported to the preprocessing chamber 106 via the delivery chamber 103 and the transportation chamber 104. In the preprocessing chamber 106, the surface of the semiconductor layer is preprocessed for contact angle measurements. In the present embodiment, it order to conduct accurate measurements on the surface of the semiconductor layer, an oxide film that was formed on the surface of the semiconductor layer is removed with hydrofluoric acid (HF) as the preprocessing. The preprocessed semiconductor film 101 is introduced into the contact angle measurement chamber 105 via the transportation chamber 104.

Figure 3:
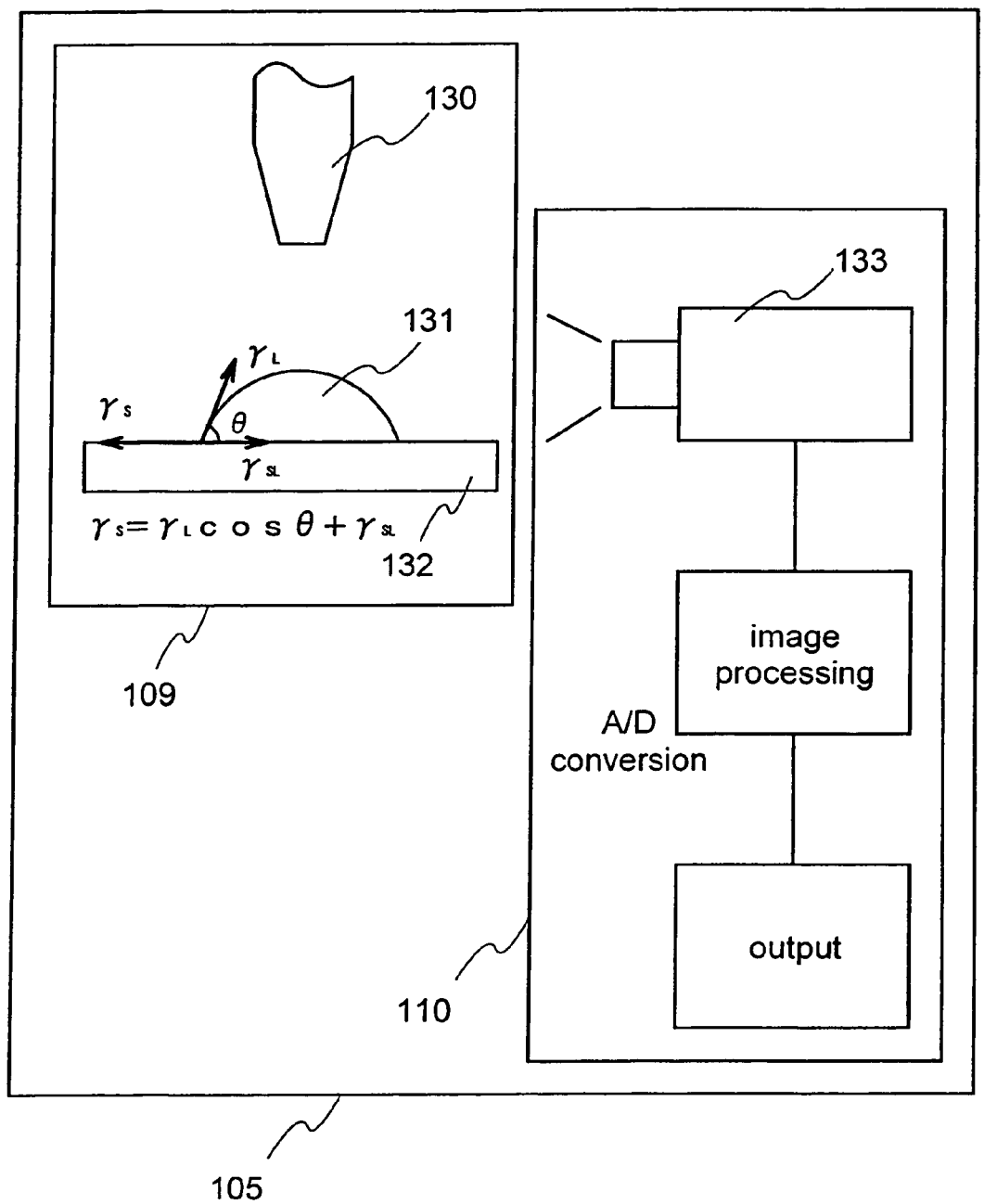
FIG. 3 is a diagram showing a configuration of the present invention.

In the contact angle measurement chamber 105 provided with means for measuring a contact angle, there are provided the contact angle measurement device 109 and medium 110 for storing and transmitting the measurement information. The medium 110 for storing and transmitting the measurement information comprises means for loading images, a computer unit for conducting image processing, and an output unit for outputting the values of contact angle. For example, a charge coupled element (CCD) camera 133 is used as the means for loading images, the images are loaded, and the information is transmitted to the analytical unit 111 with the output unit. Instead of the CCD camera, an image sensor using a complimentary metal oxide semiconductor (CMOS) can be also used as the means for loading the images. The details are shown in FIG. 3. In the present embodiment, the analysis is conducted, for example, by a tangent line method by using a liquid drop method, but such as a gradient method, a perpendicular plate immersion method, and a downfall method may be also used. The analysis may also use a θ/2 method or a three-point click method. With the θ/2 method, a drop is assumed as part of a circle and the result is derived from a geometric theorem. With the three-point click method, a contact angle is measured by clicking one point on the circumference of a circle and a solid-liquid contact point of the loaded drop image on a monitor screen and conducting processing with a computer. The three-point click method essentially involves clicking on three points, but with huge liquids such that cannot be assumed to have a perfect round shape, more accurate measurements of contact angle can be conducted by clicking on four or more points.

The contact angle measurement chamber 105 equipped with the means for measuring a contact angle, as shown in FIG. 3, is provided with the contact angle measurement device 109 having a liquid dropping nozzle 130. Furthermore, there is also provided the medium 110 for storing and transferring the measured information, this medium comprising a camera 133 which is means for loading the images, a computer unit for conducting image processing, and an output unit for outputting the values of a contact angle. The liquid 131 that was dropped from the liquid dropping nozzle 130 onto a semiconductor film 132 assumes a drop shape shown in FIG. 3. The relationship between the surface tension $\gamma_S$ of a solid, the surface tension $\gamma_L$ of a liquid, the contact angle (liquid wetting angle) θ, and the interface tension $\gamma_{SL}$ between the solid and the liquid is represented by the above-described Formula 1. The images loaded by the camera 133 are analyzed by image processing and the values of contact angle are outputted. In the present embodiment, the drop image is loaded via the camera 133 by using a tangent line method and image processing, analysis, and output are conducted with a computer. However, the present embodiment is not limited, provided that the contact angle can be measured.

Characteristics of the semiconductor film are judged by the information on the carrier concentration and conductivity type that are made clear by the measured values of contact angle. In the analytic device 111 which is means for judging the conductivity type and carrier concentration of the semiconductor layer by the contact angle measured, a contact angle is measured by above-described contact angle measurement method, and the carrier concentration and conductivity type thereof are analyzed and judged. The analyzed information is transmitted to the control unit 112. A contact angle changes following changes in the carrier concentration, and the value thereof and the mode of changing also differ depending on the dopant element creating the carriers. Therefore, the measured value of the contact angle is compared with the value of contact angle at an optimum concentration of carriers created by the dopant that was doped, and if the concentration is small, doping may be conducted. In other words, the amount (dose) of the dopant element that should be doped into the semiconductor layer is determined.

The control unit 112 functions as means for feeding back the amount of the dopant element providing one conductivity type that should be doped into the semiconductor layer to the doping means based on the judgment results. If doping is necessary based on this information, the control unit 112 indicates doping to the control unit 113 of the doping unit. The control unit of the doping unit that received the indication conducts doping of a dopant into the semiconductor film 101 in the doping chamber 100 via the reception chamber 103. Then, a contact angle of the semiconductor layer surface is measured again and doping into the semiconductor layer is conducted till the carrier concentration optimum for obtaining the desired characteristics is obtained. If the surface of the semiconductor layer has not been exposed, then the preprocessing is carried out in the above-described manner prior to the contact angle measurement.

In accordance with the present invention, the characteristics of a semiconductor can be measured non-destructively and in an easy manner, and optimum doping conditions can be determined by feeding back the information. Because of the non-destructive inspection and simple manner, in-situ measurements of substrates in actual production line are possible. Because monitoring can be conducted on actual substrates, inaccuracy of measurements is extremely small. Further, the activation ratio of the dopant in the semiconductor, which is a factor relating to actual electric characteristics, can be accurately measured and the conductivity type of the semiconductor can be also distinguished.

The present invention can provide a doping apparatus and a doping method by which the characteristics of a semiconductor can be momentarily and accurately comprehended non-destructively and in an easy manner by in-situ monitoring the characteristics, and doping can be conducted under optimum conditions allowing the desired characteristics to be obtained by feeding back this information to the process. The present invention can also provide a method for the fabrication of a thin film transistor using the doping apparatus and the doping method.

Embodiment 1

In the present embodiment, a method for fabricating an active matrix substrate by using the present invention will be explained with reference to FIG. 4, FIG. 5, and FIG. 9. An active matrix substrate has a plurality of TFT, but the explanation relates to a case where the substrate has a drive circuit portion having an n-channel TFT and a p-channel TFT and a pixel portion having an n-channel TFT and a p-channel TFT.

A silicon nitride oxide film with a thickness of 10-200 nm (preferably, 50-100 nm) is formed by a plasma CVD method as a base film 301 on a substrate 300 having an insulating surface, and a silicon oxynitride film with a thickness of 50-200 nm (preferably, 100-150 nm) is laminated thereon. In the present embodiment, the silicon nitride oxide film is formed in a thickness of 50 mm and the silicon oxynitride film is formed in a thickness of 100 nm by the plasma CVD method. A glass substrate, a quartz substrate, a silicon substrate, a metal substrate or a stainless steel substrate having an insulating film formed on the surface thereof may be used as the substrate 300. Furthermore, a heat-resistant plastic substrate capable of withstanding the treatment temperature of the present embodiment may be also used, and a flexible substrate may be also used. A two-layer structure may be also used as the base film, and a single-layer film or a multilayer structure including two or more layers of the base (insulating) film may be used.

A semiconductor film 360 is then formed on the base film. The semiconductor film may be formed in a thickness of 25-200 nm (preferably, 30-150 nm) by well-known means (sputtering method, LPCVD method, plasma CVD method, or the like). The material of the semiconductor film 360 is not limited, but it is preferably formed from silicon, a silicon-germanium (SiGe) alloy, or the like.

In the present embodiment, an amorphous silicon film was formed by a plasma CVD method in a thickness of 54 nm as the semiconductor film 360. In the present embodiment, a thermal crystallization method and a laser crystallization method using a metal element for enhancing the crystallization of the amorphous silicon film is conducted, but alternatively laser crystallization may be also conducted by reducing the concentration of hydrogen contained in the amorphous silicon film to $1 \times 10^{20}$ atoms/cm$^3$ or less by heating for 1 h at a temperature of 500° C. in a nitrogen atmosphere, without introducing a metal element into the amorphous silicon film. This is because, if an amorphous silicon film containing a large amount of hydrogen is illuminated with a laser beam, the film is destructed.

Nickel is used as the metal element and introduced on the amorphous silicon film by a solution coating method. The method for introducing the metal element into the amorphous silicon film is not limited especially, provided that the metal element can be caused to be present on the surface of or inside the amorphous silicon film. For example, a sputtering method, a CVD method, a plasma treatment method (including a plasma CVD method) a desorption method, and a method for coating a solution of a metal salt can be used. Among them, the method using a solution has good utility because it is simple and allows the concentration of the metal element to be easily adjusted. Furthermore, it is preferred that an oxide film be formed by irradiation with UV light in oxygen atmosphere, thermal oxidation method, treatment with hydrogen peroxide or ozonized water containing hydroxy radicals, or the like in order to improve the wettability of the surface of the amorphous semiconductor film and spread the aqueous solution over the entire surface of the amorphous silicon film.

Heat treatment is then conducted for 4-20 h at a temperature of 500-550° C. and the amorphous silicon film is crystallized. In the present embodiment, nickel was used as the metal element, a metal-containing layer was formed and introduced on the amorphous silicon film by a solution coating method, and a first crystalline silicon film was obtained by conducting heat treatment for 4 h at a temperature of 550° C.

Crystallization is then enhanced by illuminating the first crystalline silicon film with laser light, and a second crystalline silicon film is obtained. With the laser crystallization method, a semiconductor film is illuminated with laser light. The laser used is preferably a solid laser, a gas laser, or a metal laser with pulsed or continuous oscillation. Examples of a solid laser include, a YAG laser, a $YVO_4$ laser, a YLF laser, a $YAlO_3$ laser, a glass laser, a ruby laser, an alexandrite laser, and a Ti-sapphire laser. Examples of a gas laser include an excimer lasers, an Ar laser, a Kr laser, and a $CO_2$ laser, and examples of a metal laser include a helium-cadmium laser, a copper vapor laser, and a gold vapor laser. The laser beam can be converted into higher harmonics with a nonlinear optical element. In terms of conversion efficiency, excellent results are obtained if, for example, crystals called LBO, BBO, KDP, KTP, KB5, or CLBO are used for the nonlinear optical element. The conversion efficiency can be greatly increased if those nonlinear optical elements are placed into the laser resonator. In higher harmonics lasers, Nd, Yb, Cr, or the like is generally doped, and laser is oscillated when it is excited. The dopant type may be appropriately selected by a user. A semiconductor film may be an amorphous semiconductor film, a microcrystalline semiconductor film, and a crystalline semiconductor film. A compound semiconductor film having an amorphous structure such as an amorphous silicon—germanium film and an amorphous silicon carbide film may be employed.

Figure 4A:
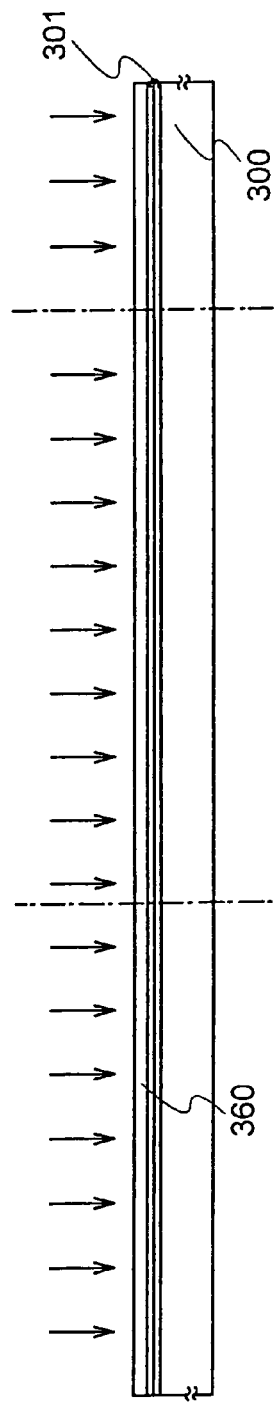
FIGS. 4A to 4C are cross-sectional views showing a fabricating process of an active matrix substrate.

The crystalline semiconductor film 360 thus obtained is doped with a minute amount of dopant element (boron or phosphorus) to control the threshold voltage of a TFT (FIG. 4A).

The present invention is used in the doping process.

Preprocessing of the semiconductor film 360 is conducted in a preprocessing chamber. The preprocessing is conducted to expose the surface of the semiconductor layer and measure a correct contact angle. Therefore, the preprocessing may be omitted if the surface of the semiconductor layer has been already exposed. In the present embodiment, a silicon film, which is easy to oxidize, is used for the semiconductor layer. Therefore, the silicon film is oxidized and an oxide film is formed on the surface. This oxide film is removed with hydrofluoric acid (HF). This treatment with hydrofluoric acid exposes the surface of the semiconductor layer and prepares it for measuring the contact angle. The pretreated semiconductor layer is transported into a contact angle measurement chamber where the contact angle is measured with a contact angle measurement device.

In the silicon film used in the present embodiment, the oxide film etching conducted with hydrofluoric acid as a preprocessing decreases the number of hydroxyl groups on the surface. As a result, the surface of the silicon film treated with hydrofluoric acid is terminated with a monomolecular film of hydrogen and a contact angle with respect to water increases. In other words, the surface becomes hydrophobicity.

If the semiconductor film taking on hydrophobicity is doped with a dopant, then a contact angle varies depending on the carrier concentration in the semiconductor film and the conductivity type of the carrier. When a silicon film is doped with boron and phosphorus, a contact angle increases as the concentration of phosphorus rises in case of phosphorus, and a contact angle decreases as the concentration of boron rises in case of boron. Therefore, the activation ratio and conductivity type of the carrier in a semiconductor layer can be clarified by a contact angle.

This information is used to verify whether the carrier concentration and conductivity type allow the desired characteristics to be obtained, and doping of a dopant element (boron or phosphorus) is carried out if necessary. A contact angle is measured again after doping, and the doping process is conducted by feeding back the information till the carrier concentration and conductivity type thereof are optimized. The semiconductor film for which the carrier concentration and conductivity type were optimized is advanced to subsequent processing.

In accordance with the present invention, the characteristics of a semiconductor can be measured non-destructively and in an easy manner, and optimum carrier concentration and conductivity type thereof can be obtained by feeding back the information. Because of the non-destructive inspection and simple manner, in-situ measurements can be conducted on substrates in an actual production line. Because monitoring can be conducted on actual fabricated substrates, inaccuracy of measurements is extremely small.

Further, the characteristics of the semiconductor can be momentarily and accurately comprehended non-destructively and in an easy manner by in-situ monitoring the characteristics, and doping can be conducted under optimum conditions allowing the desired characteristics to be obtained by feeding back this information to the process. Therefore, there is no time lag in the feedback and the yield is also increased.

Figure 4B:
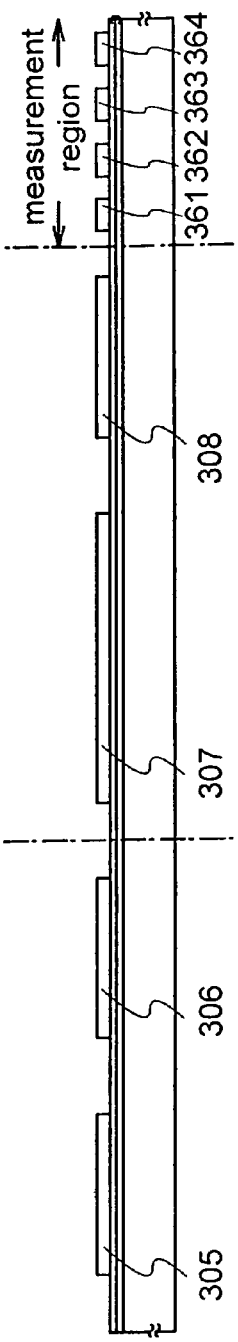

Semiconductor layers 305-308, 361-364 are formed by patterning using photolithography (FIG. 4B). Referring to FIG. 4B, the semiconductor layers 361-364 in the measurement region represent the measurement region for monitoring carrier concentration in accordance with the present invention. Therefore, in the present embodiment, because dopant regions of four types with different carrier concentrations are fabricated, four semiconductor layers are formed, but the present invention is not limited to the present embodiment, and the appropriate measurement region may be provided according to respective a process or a structure.

A gate insulating film 309 covering the semiconductor layers 305-308 is formed. The gate insulating film 309 is formed from an insulating film containing silicon and having a thickness of 40-150 nm by using a plasma CVD method or sputtering method. In the present embodiment, a silicon oxynitride film with a thickness of 115 nm was formed by a plasma CVD method. It goes without saying, that the gate insulating film is not limited to the silicon oxynitride film, and other insulating films may be used as a single layer or as a laminated structure.

Figure 4C:
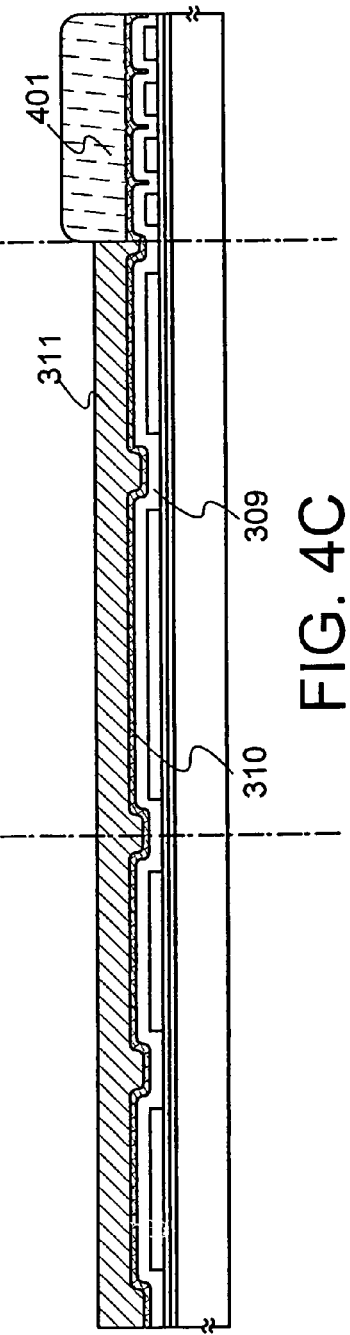

A first conductive film with a thickness of 20-100 nm and a second conductive film with a thickness of 100-400 nm are then formed on the gate insulating film. The first conductive film and second conductive film may be formed from an element selected from the group consisting of Ta, W, Ti, Mo, Al, and Cu, or from an alloy material or a compound material containing those elements as the main components. Furthermore, a semiconductor film represented by a polycrystalline silicon film doped with a dopant element such as phosphorus or a AgPdCu alloy may be also used for the first conductive film and second conductive film. Furthermore, the film is not limited to the two-layer structure. For example a three-layer structure obtained by laminating a tungsten film with a thickness of 50 nm, an aluminum-silicon alloy (Al—Si) film with a thickness of 500 nm, and a titanium nitride film with a thickness of 30 nm in the order of description may be used. When a three-layer structure is used, tungsten nitride may be used instead of tungsten of the first conductive film, an aluminum-titanium alloy film (Al—Ti) may be used instead of the aluminum-silicon alloy (Al—Si) film of the second conductive film, and a titanium film may be used instead of the titanium nitride film of the third conductive film. A single-layer structure may be also employed. Further, in the present embodiment, a tantalum nitride film with a thickness of 30 nm and a tungsten film with a thickness of 370 nm were formed by lamination in the order of description on the gate insulating film 309 (FIG. 4C). In this case, in the present embodiment, in the semiconductor layers 361-364 of the measurement region, after the first conductive layer 301 has been formed, it was covered with a mask 401, and the second conductive layer 311 was not formed.

A mask composed of a resist is then formed by using photolithography, and a first etching treatment for forming electrodes and wiring is conducted. The first conductive film and the second conductive film can be etched to the desired tapered shape by using an ICP (Inductively Coupled Plasma) etching method and appropriately adjusting the etching conditions (electric energy applied to coil electrodes, electric energy applied to electrodes on the substrate side, temperature of electrodes on the substrate side, or the like). Chlorinated gases represented by $Cl_2$, $BCl_3$, $SiCl_4$, $CCl_4$, fluorinated gases represented by $CF_4$, $SF_6$, $NF_3$, or the like, or $O_2$ can be appropriately used.

Conductive layers (first conductive layer and second conductive layer) of a first shape composed of the first conductive layer and second conductive layer are formed by the first etching treatment.

Then, a second etching treatment is conducted without removing masks 365, 366, 367a, 367b, 368, and 377 composed of a resist. Here, a W film is selectively etched. At this time, the second conductive layers 322b-326b are formed by the second etching treatment. On the other hand, the first conductive layers 322a-326a are practically not etched, and in the measurement region for forming the conductive layers 322-326 of a second shape, a mask 377 composed of a resist is formed only on the semiconductor layer 364 and the first conductive layers present on the semiconductor layers 361-363 are removed by etching (FIG. 5A).

Then, the first doping treatment is conducted without removing the mask composed of the resist, and a dopant element providing the n-type conductivity is added at a low concentration level to the semiconductor layer (FIG. 5B). The doping treatment may be carried out by an ion doping method or an ion injection method. Elements of a Group 15, represented by phosphorus (P) or arsenic (As), are used as the dopant element providing the n-type conductivity, but here phosphorus (P) is used. In this case, the mask 377 composed of a resist and the conductive layers 322-326 serves as the mask with respect to the dopant element providing the n-type conductivity, and dopant regions 369-375 are formed with self-aligning. In the dopant region, the dopant element providing the n-type conductivity is added within a concentration range of $1 \times 10^{18}$–$1 \times 10^{20}/cm^3$.

In order to measure the concentration of carriers in this low-concentration dopant region, the gate insulating film 309 located on the dopant region 373 is removed by etching, pretreatment is carried out to expose the surface, a contact angle of water with the dopant region 373 of the semiconductor layer is measured and analyzed, and the concentration of carriers in the low-concentration dopant region is measured. The conductivity type of the carriers can be also made clear based on a contact angle, but in the present embodiment, the conductivity type of the carriers is the n type because phosphorus providing the n-type conductivity has been doped. Because in the case of phosphorus, a contact angle increases with the increase in carrier concentration, when the measured value of a contact angle is less than that of the contact angle corresponding to the desired carrier concentration, additional doping has to be carried out. Thus, in accordance with the present invention, feedback can be conducted in the course of the doping process, without a time lag. Therefore, a dopant region having the optimum carrier concentration can be formed.

After the masks 365-368 and 377 composed of a resist have been removed, masks 378, 379a, 379b, and 381 composed of a resist are newly formed, and a second doping treatment is carried out at an accelerating voltage higher than that of the first doping treatment. In this doping treatment, the second conductive layer 323b is used as a mask for the dopant element, and doping is conducted so that the dopant element is added to the semiconductor layer below the tapered portion of the first conductive layer. Then, the accelerating voltage is lowered with respect to that of the second doping treatment and a third doping treatment is conducted. As a result of the second doping treatment and the third doping treatment, a dopant element providing the n-type conductivity is added in a concentration range of $1 \times 10^{18}$–$5 \times 10^{19}/cm^3$ to a low-concentration dopant region 383 which overlaps the first electrically conductive layer, and a dopant element providing the n-type conductivity is added in a concentration range of $1 \times 10^{19}$–$5 \times 10^{21}/cm^3$ to high-concentration dopant regions 382, 384, 386 (FIG. 5C).

It goes without saying that with an appropriate acceleration voltage, the second doping treatment and the third doping treatment can also form the low-concentration dopant region and the high-concentration dopant region by a single doping treatment.

The high-concentration dopant region 386 is used to monitor the optimization of the carrier concentration of the high-concentration dopant regions 382, 384. As with the process relating to the low-concentration dopant region, the gate insulating film 309 is removed by etching so that the surface of the high-concentration dopant region 386 is exposed, and the surface of the dopant region 400 is treated. Then, a contact angle with water is measured and analyzed and the carrier concentration of the high-concentration dopant region is measured. The measurement results are fed back to the doping process to obtain a contact angle corresponding to the desired carrier concentration. Thus, in accordance with the present invention, because in-situ evaluation is conducted and feedback can be carried out in the course of the doping process, without a time lag, a dopant region having the optimum carrier concentration can be formed.

Then, after the mask composed of a resist has been removed, masks 387, 389 and 390 are newly formed of a resist and a fourth doping treatment is conducted. This fourth doping treatment forms dopant regions 391-396 having added a dopant element providing a conductivity type which is opposite to the aforementioned conductivity type in the semiconductor layer serving as an active layer of a p-channel TFT (FIG. 9A). Furthermore, if the semiconductor layers 385 and 400 are not used as sensors, as in the present embodiment, then the formation of the mask 390 composed of a resist may be omitted. Furthermore, a dopant may be even introduced into semiconductor layers 385 and 400 to obtain carrier concentration monitors for other dopant regions and an appropriate design may be made. The first and second conductive layers 322a, 322b, 326a, and 326b are used as masks for the dopant elements and the dopant regions are formed with self-aligning by adding the dopant element providing the p-type conductivity. In the present embodiment, the dopant regions (low-concentration dopant region or high-concentration dopant region) 391-396 are formed by an ion doping method using diborane ($B_2H_6$). During this fourth doping treatment, the semiconductor layer forming the n-channel TFT is covered with a mask composed of a resist. With the first to third doping treatments, phosphorus is added to the dopant region at respective different concentrations, but conducting the doping treatment so that the concentration of the dopant element providing the p-type conductivity becomes $1\times10^{19}$–$5\times10^{21}$ atoms/cm$^3$ in all the regions, eliminates any problems relating to those dopant regions functioning as the source region and the drain region of the p-channel TFT.

Further, in the present embodiment, the dopant region 396 is used as the carrier concentration monitor of the low-concentration dopant regions 392 and 394 providing the p-type conductivity, and the dopant region 395 is used as the carrier concentration monitor of the high-concentration dopant regions 391 and 393 providing the p-type conductivity. The carrier concentration is optimized by using the present invention in the same manner as in the dopant region providing the n-type conductivity.

In order to measure the concentration of carriers in this p-type dopant region, the gate insulating film 309 located on the dopant regions 395 and 396 and the first conductive layer 310 located over the dopant region are removed by etching, preprocessing is carried out to expose the surface, a contact angle of water with the dopant regions 398 and 399 is measured and analyzed, and the concentration of carriers in the respective dopant regions is measured. The conductivity type of the carriers can be also made clear based on a contact angle, but in the present embodiment, the conductivity type of the carriers is the p type because boron, which is a p-type dopant, is doped. Because a contact angle decreases with the increase in carrier concentration provided by boron, when the measured value of a contact angle is higher than that of a contact angle corresponding to the desired carrier concentration, additional doping has to be carried out. The concentration of carriers in the high-concentration dopant regions 391 and 393 and the low-concentration dopant regions 392 and 394 providing the p-type conductivity is thus optimized. Thus, in accordance with the present invention, feedback is conducted in the course of the doping process, without a time lag. Therefore a dopant region having the optimum carrier concentration can be formed.

Dopant regions are formed in respective semiconductor layers by the above-described processes.

An insulating film 349 is then formed as a passivation film after removing the mask composed of the resist (FIG. 9B). A insulating film containing silicon and having a thickness of 100-200 nm is formed as the insulating film 349 by using a plasma CVD method or a sputtering method. It goes without saying, that the insulating film 349 is not limited to a silicon oxynitride film, and other insulating films comprising silicon may be used as a single layer or a multilayer structure. In the present embodiment, a silicon nitride oxide film with a thickness of 150 nm is formed by a plasma CVD.

Then, heat treatment is conducted for 1-12 h at a temperature of 300-550° C. in a nitrogen atmosphere and a process of hydrogenating the semiconductor layer is carried out. The process is preferably carried out at a temperature of 400-500° C. This is the process in which dangling bonds of the semiconductor layer are terminated with hydrogen contained in the first insulating film 349. In the present embodiment, the heat treatment is conducted for 1 h at a temperature of 410° C.

The insulating film 349 is formed of a material selected from substances comprising silicon nitride, silicon oxide, silicon oxynitride (SiON), silicon nitride oxide (SiNO), aluminum nitride (AlN), aluminum oxynitride (AlON), aluminum nitride oxide with a content of nitrogen higher than the content of oxygen, aluminum oxide, diamond-like carbon (DLC), nitrogen-containing carbon film (CN), and siloxane-based polymers.

Further, in accordance with the present invention, a film containing Si 25-35 at.%, oxygen 55-65 at.%, nitrogen 1-20 at. %, and hydrogen 0.1-10 at.% is shown as a silicon oxynitride (SiON) film, and a film containing Si 25-35 at.%, oxygen 15-30 at.%, nitrogen 20-35 at.%, and hydrogen 15-25 at.% is shown as a silicon nitride oxide (SiNO) film.

Heating treatment, irradiation with high-intensity light, and irradiation with laser light may be carried out for activating the dopant element. Restoration of plasma damage of the gate insulating film or plasma damage of the interface of the gate insulating film and the semiconductor layer can be conducted simultaneously with the activation.

Further, an interlayer film 350 comprising an organic resin material is formed on the insulating film 349. The interlayer film 350 is a film composed of an inorganic material (silicon oxide, silicon nitride, silicon oxynitride, silicon nitride oxide, and the like), a photosensitive or non-photosensitive organic resin material (organic resin material) (polyimide, acryl, polyamide, polyimidoamide, resist, benzocyclobutene, siloxane polymer, and the like), or several such materials. A laminate composed of such films can be also used. Furthermore, a photosensitive negative-type material which becomes insoluble in an etchant under light irradiation, or a photosensitive positive-type material which becomes soluble in an etchant under light irradiation can be used for the interlayer film. In the present embodiment, a positive-type photosensitive acryl which is a photosensitive organic resin material is used. In this case, it is preferred that a curved surface having a curvature radius of 0.2 μm to 3 μm be provided only at the upper end portion of the interlayer film. A passivation film composed of silicon nitride, silicon oxide, silicon oxynitride (SiON), silicon nitride oxide (SiNO), aluminum nitride (AlN), aluminum oxynitride (AlON), aluminum nitride oxide (AlNO) with a nitrogen content higher than the oxygen content, aluminum oxide diamond-like carbon (DLC), nitrogen-containing carbon film (CN), and a siloxane-based polymer may be thereafter formed on the interlayer film 350.

The interlayer film 350, the insulating film 349, and the gate insulating film 309 are etched and holes reaching the source region and drain region are formed. The holes may be formed by etching the interlayer film and then again forming a mask, or by using the etched interlayer film 350 as a mask and etching the insulating film 349 and the gate insulating film. A metal film is formed, and a source electrode or a drain electrode 352, and wiring (not shown in the figure) electrically connected to respective dopant regions are formed by etching the metal film. The metal film may be a film composed of aluminum (Al), titanium (Ti), molybdenum (Mo), tungsten (W), or silicon (Si), or an alloy film using those elements. Further, in the present embodiment, a titanium film, a silicon-aluminum alloy film, and a titanium film (Ti/Si—Al/Ti) are laminated at 100/350/100 nm, respectively, and then the source electrode or the drain electrode 352 and wiring (not shown in the figure) are formed by patterning and etching to a desired shape.

A pixel electrode 353 is then formed. In the present embodiment, a transparent conductive film is formed and the pixel electrode 353 is formed by etching the film to a desired shape (FIG. 9C). In the present embodiment, a measurement region having a semiconductor layer that will serve as a monitor is formed, and once the carrier concentration of the dopant region has been optimized and the monitoring function becomes unnecessary, this region may be removed or may be left as is on the substrate. The operator can make an appropriate decision according to the structure and design of the display device which is to be fabricated.

A compound of indium oxide and tin oxide, a compound of indium oxide and zinc oxide, zinc oxide, tin oxide, or indium oxide can be used for the transparent conductive film. Furthermore, a transparent conductive film additionally containing gallium may be used. The pixel electrode 353 may be formed on a flat interlayer insulating film prior to forming the aforementioned wiring. An effective method is to flatten the step created due to a TFT by using a planarizing film composed of a resin. Because a light-emitting layer which is to be formed thereafter is very thin, the presence of the step sometimes causes emission defect. Therefore, flattening is preferably conducted prior to forming the pixel electrodes so that the light-emitting layer is formed to have a surface as flat as possible.

The above-described process produces an active matrix substrate equipped with a TFT. In the present embodiment, the n-channel TFT of a pixel region is used a double-gate structure in which two channel formation regions are formed, but a single-gate structure in which one channel formation region is formed or a triple-gate structure in which three channel formation regions are formed may be also used. Furthermore, the TFT of a drive circuit portion has a single-gate structure in the present embodiment, but it may also have a double-gate structure or triple-gate structure.

The present invention is not limited to the TFT fabrication method described in the present embodiment and can be applied to a top-gate structure (planar structure), bottom-gate structure (inverted stagger structure), dual-gate structure which has two gate electrodes disposed via a gate insulating film above and below the channel region, and other structures.

Embodiment 2

In the present embodiment an example of the fabrication of a light-emitting display device using an active matrix substrate fabricated in Embodiment 1 will be explained. In accordance with the present invention, a light-emitting display device is a generic term applied to a display panel in which light-emitting elements formed on a substrate are inserted between the substrate and a cover material and to a display module in which TFT are provided on the aforementioned display panel. The light-emitting element has a layer (light-emitting layer) comprising an organic compound capable of producing EL, an anode layer, and a cathode layer. The luminescence in an organic compound includes light emission (fluorescence) induced by the return from a singlet excitation state to a ground state and light emission (phosphorescence) induced by the return from a triplet excitation state to a ground state. Any of light-emitting materials which emits light through singlet excitation, triplet excitation or both of them may be used for EL material in accordance with the invention.

Further, in accordance with the present invention, all the layers formed between the anode and the cathode in a light-emitting element are defined as organic light-emitting layers. More specifically, the organic light-emitting layers include a light-emitting layer, a hole injection layer, an electron injection layer, a hole transport layer, an electron transport layer, and the like. Basically, the light-emitting element has a structure in which an anode layer, a light-emitting layer, and a cathode layer are stacked in the order of description. There are also light-emitting elements having a structure in which an anode layer, a hole injection layer, a light-emitting layer, and a cathode layer are stacked or a structure in which an anode layer, a hole injection layer, a light-emitting layer, an electron transport layer, and a cathode layer are stacked in the order of description.

Figure 6:
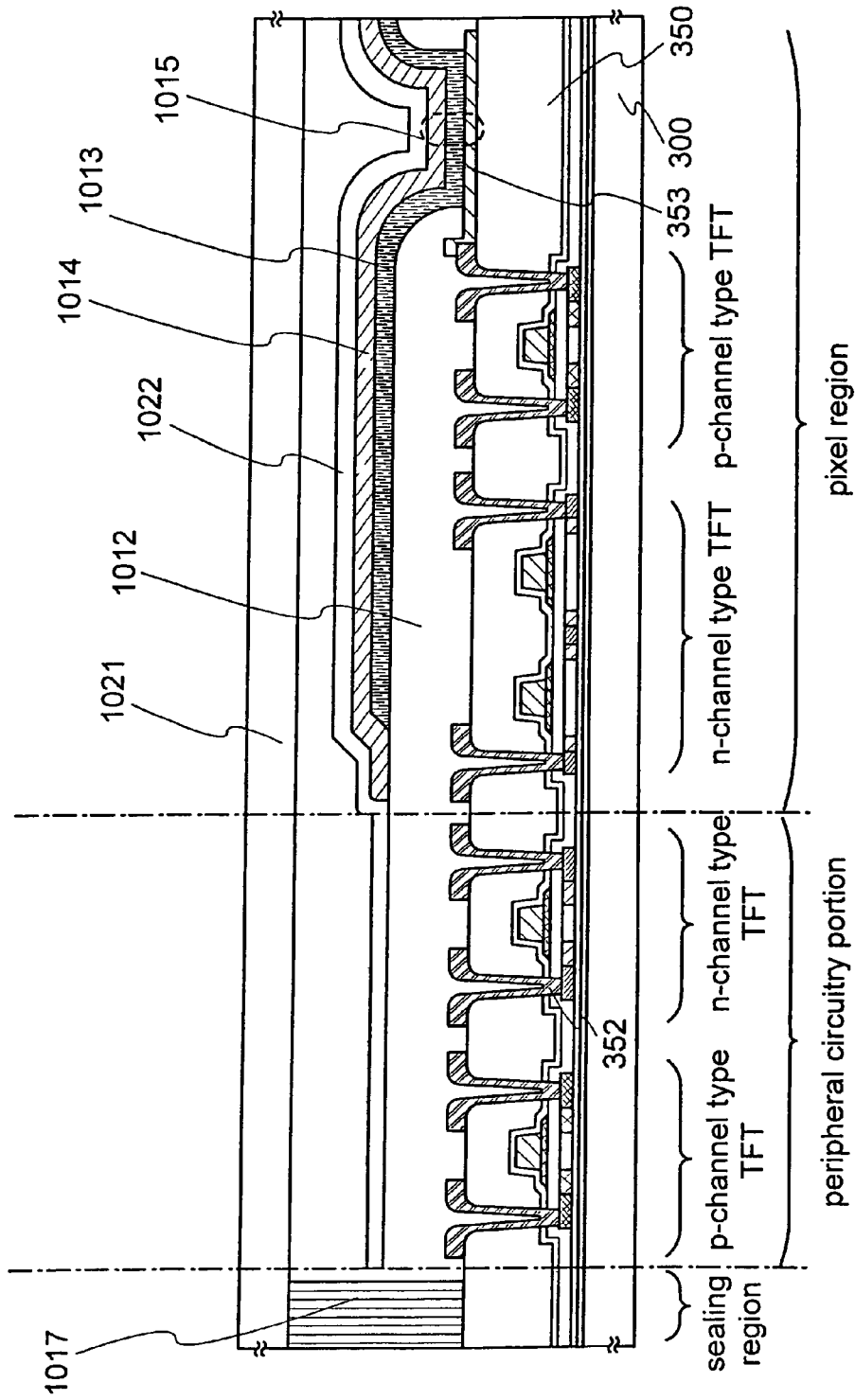
FIG. 6 is a cross-sectional view of a light-emitting display device of the present invention.

After the pixel electrode 353 has been formed, an insulator 1012 is formed as shown in FIG. 6. The insulator 1012 may be formed by patterning silicon-containing insulating film or organic resin film with a thickness of 100-400 nm.

Further, because the insulator 1012 is an insulating film, attention should be paid to electrostatic destruction of elements during film formation. In the present embodiment, the resistivity is decreased and the generation of electrostatic charges is inhibited by adding carbon particles or metal particles to the insulating film serving as a material for the insulator 1012. In this case, the amount of carbon particles or metal particles that are added may be adjusted so that the resistivity becomes $1\times10^6$–$1\times10^{12}$ Ohm (preferably, $1\times10^8$–$10^{10}$ Ohm).

A light-emitting layer 1013 is formed on the pixel electrode 353. Only one pixel is shown in FIG. 10, but in the present embodiment the light-emitting layers corresponding to each color of R (red), G (green), and B (blue) are formed separately. Furthermore, in the present embodiment, a low-molecular weight organic light-emitting material is formed by a deposition method. More specifically, a laminated structure is obtained in which a copper phthalocyanine (CuPc) film with a thickness of 20 nm is provided as a hole injection layer and a tris-8-quinolinolate aluminum complex ($Alq_3$) film with a thickness of 70 nm is provided as a light-emitting layer thereupon. The color of emitted light can be controlled by adding fluorescent dye such as quinacridone, perylene, or DCM 1 to $Alq_3$.

The above-described examples are only the examples of the organic light-emitting materials that can be used for the light-emitting layer, and it is absolutely not necessary to be limited thereto. The light-emitting layer (a layer for emitting light and inducing the movement of carriers) may be formed by freely combining a light-emitting layer, a charge transport layer or a charge injection layer. For example, in the present embodiment an example is described in which a low-molecular weight organic light-emitting material is used for the light-emitting layer. However, organic medium-molecular weight or high-molecular weight light-emitting materials may be also used. Further, in the present specification, an organic light-emitting material having no sublimation ability and a number of molecules of 20 or less or a molecular chain length of 10 μm or less is considered as a medium-molecular weight organic light-emitting material. As an example of using a high-molecular weight organic light-emitting material, a laminated structure may be considered in which a 20 nm polythiophene (PEDOT) film is provided as a hole injection layer by a spin coating method and a paraphenylene vinylene (PPV) film with a thickness of about 100 nm is provided thereupon as a light-emitting layer. Further, emission wavelength can be selected from red color to blue color by using a PPV π-conjugated polymer. Further, an inorganic material such as silicon carbide can be also used as a charge transport layer or a charge injection layer. Well-known materials can be used as the aforementioned organic light-emitting materials or inorganic materials.

A cathode 1014 composed of a conductive film is then formed on the light-emitting layer 1013. A material with a low work function (Al, Ag, Li, Ca, or alloys thereof such as MgAg, MgIn, AlLi, $CaF_2$, or CaN) may be used for the cathode. In the present embodiment, a laminate of a thin metal film of reduced thickness (MgAg: film thickness 10 nm) and a transparent conductive film with a thickness of 110 nm (ITO (indium oxide-tin oxide alloy), indium oxide-zinc oxide alloy, zinc oxide, tin oxide, or indium oxide) is used as the cathode 1014 to transmit the emitted light.

The formation of a light-emitting element 1015 is completed when the cathode 1014 is formed. The light-emitting element 1015 is formed from the pixel electrode (anode) 353, the light-emitting layer 1013, and the cathode 1014.

Providing a passivation film 1022 is effective for completely covering the light-emitting element 1015. Insulating films of silicon nitride, silicon oxide, silicon oxynitride (SiON), silicon nitride oxide (SiNO), aluminum nitride (AlN), aluminum oxynitride (AlON), aluminum nitride oxide with a nitrogen content higher than a oxygen content, aluminum oxide, diamond-like carbon (DLC), nitrogen-containing carbon film (CN), and a siloxane-based polymer can be used in the structure of a single layer or combined laminates as the passivation film.

It is preferred that a film with good coverage be used as the passivation film, and using a carbon film, especially, a DLC film is effective. A DLC film can be formed at a temperature within a range of from room temperature to less than 100° C. Therefore, it can be easily formed on the light-emitting layer 1013 which has low heat resistance. Furthermore, DLC films demonstrate good blocking effect with respect to oxygen and can inhibit oxidation of the light-emitting layer 1013. Therefore, a problem of the light-emitting layer 1013 being oxidized while the subsequent sealing process is conducted can be prevented.

No specific limitation is placed on a sealing material 1017. Typically it is preferred that an indurative resin with visible light, an indurative resin with UV ray, or a thermosetting resin is used. In the present embodiment, a thermosetting epoxy resin is used. Furthermore, in the present embodiment a glass substrate, a quartz substrate, a plastic substrate (including plastic films), or a flexible substrate having carbon films (preferably, DLC films or CN films) formed on both surfaces thereof is used as a cover material 1021. Besides the carbon films, aluminum-containing films (AlON, AlN, AlO, and the like) or SiN can be used. As a result, a light-emitting display device of a dual-sided emission type which has a structure shown in FIG. 6 is obtained.

In the present embodiment, a dual-sided emission type is described in which light is emitted from both sides of a light-emitting display device, but a single-sided emission system is also possible. When light is emitted from the side of the cathode 1014, the pixel electrode 353 is a metal film having reflectivity and equivalent to an anode. A metal film with a high work function, such as platinum (Pt) or gold (Au), is used to function as an anode for the metal film having reflectivity. Furthermore, because those metals are expensive, a pixel electrode may be used in which the metals are laminated on the appropriate metal film such as an aluminum film or a tungsten film, so that platinum or gold is exposed on the outermost surface. Furthermore, the cathode 1014 is a thin (preferably 10-50 nm) metal film and a material comprising an element belonging to Group 1 or Group 2 of the periodic table of the elements that has a low metal work function, which is necessary for the material to serve as a cathode (for example, Al, Ag, Li, Ca, or alloys thereof such as MgAg, MgIn, AlLi, $CaF_2$, or CaN), is used therefor. Further, an oxide conductive film (typically, an ITO film) which is the cathode 1014 is provided by lamination on the cathode 1014. In this case, the light emitted from the light-emitting element is reflected by the pixel electrode 353 and emitted via the cathode 1014.

When light is emitted only from the side of the pixel electrode 353, a transparent conductive film is used for the pixel electrode 353 which is equivalent to an anode. A compound of indium oxide and tin oxide, a compound of indium oxide and zinc oxide, zinc oxide, tin oxide, or indium oxide can be used as the transparent conductive film. Furthermore, a metal film (thickness 50 nm to 200 nm) composed of Al, Ag, Li, Ca, or alloys thereof such as MgAg, MgIn, or AlLi is preferably used for the cathode 1014. In this case, the light emitted from the light-emitting element is emitted via the pixel electrode 353 from the side of the substrate 300.

Further, in the present embodiment, the semiconductor element fabricated by using the doping method and doping apparatus in accordance with the present invention is applied to a light-emitting display device using a light-emitting element. However, the semiconductor element in accordance with the present invention can be also applied to liquid-crystal display devices using liquid crystal. In both cases, the present invention makes it possible to fabricate a highly reliable display device demonstrating the desired characteristics with good yield.

The process prior to the formation of the passivation film after the insulator 1012 has been formed can be effectively implemented in a continuous mode without releasing the atmosphere, by using a film forming apparatus of a multi-chamber system (or inline system). Further expanding the procedure, the process prior to pasting the cover material 1021 can be implemented continuously without releasing the atmosphere.

Furthermore, providing a dopant region to a gate electrode via an insulating film makes it possible to form an n-channel TFT with a high resistance to degradation induced by a hot carrier effect. Therefore, a highly reliable display device can be realized.

Further, in the present embodiment only the configuration of the pixel portion and the drive circuit is described, but according to the manufacturing process of the present embodiment, other logic circuits such as a signal splitting circuit, a D/A converter, an operation amplifier, and a γ correction circuit can be formed on the same insulator. Moreover, a memory or a microprocessor can be also formed.

With the present invention, a highly reliable display device having the desired characteristics can be fabricated with an appropriate doping apparatus and a doping method. Furthermore, in a doping apparatus and a doping method in accordance with the present invention, the information on carrier concentration and conductivity type thereof can be fed back with a nondestructive and simple measurement method. Therefore, display devices such as a light-emitting display device or a liquid-crystal display device can be fabricated with good yield.

Embodiment 3

A variety of display devices (an active matrix type display device and an active matrix type EC display device) can be fabricated in accordance with the present invention. In other words, the present invention is applied to various electronic devices in which the display device is incorporated on the display portion.

Such an electronics device using the present invention includes a video camera, a digital camera, a projector, a head mounted display (a goggle type display), a car navigation system, a car audio system, a personal computer, a Personal Digital Assistant (a mobile computer, a cellular phone or an electronic book), or the like. These examples are shown in FIGS. 7A to 7F and FIGS. 8A to 8C.

Figure 7A:
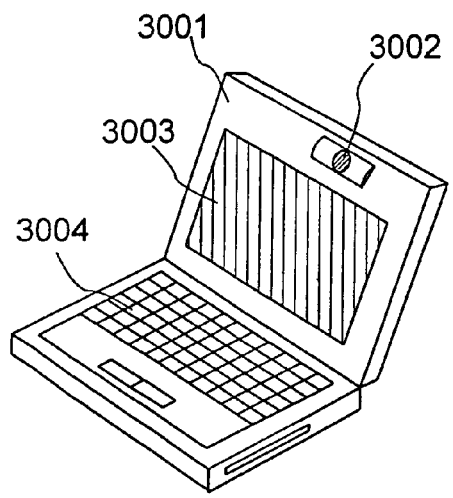
FIGS. 7A to 7F are views showing an example of display device of the present invention.

FIG. 7A is a personal computer including a body 3001, an image input portion 3002, a display portion 3003, a keyboard 3004, and the like. A display device fabricated in the present invention is applied to the display portion 3003 and thereby a personal computer of the present invention is achieved.

Figure 7B:
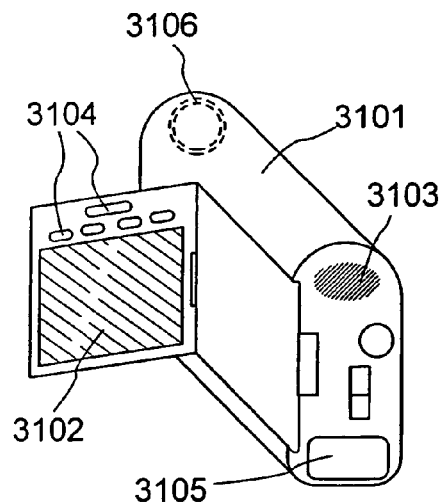

FIG. 7B is a video camera including a body 3101, a display portion 3102, an audio input portion 3103, operating switches 3104, a battery 3105, an image receiving portion 3106, and the like. A display device fabricated in the present invention is applied to the display portion 3102 and thereby a video camera of the present invention is achieved.

Figure 7C:
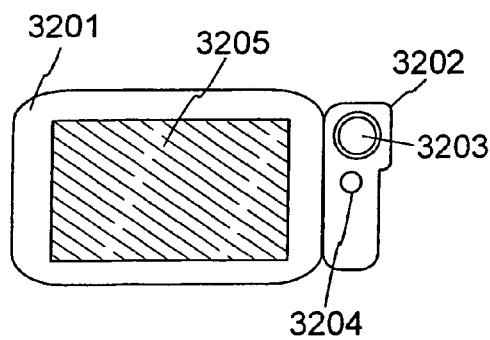

FIG. 7C is a mobile computer including a body 3201, a camera portion 3202, an image receiving portion 3203, an operating switch 3204, a display portion 3205, and the like. A display device fabricated in the present invention is applied to the display portion 3205 and thereby a mobile computer of the present invention is achieved.

Figure 7D:
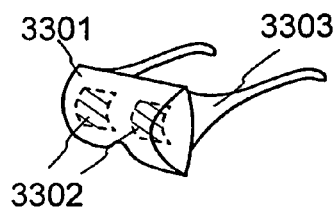

FIG. 7D is a goggle type display including a body 3301, display portions 3302, an arm portion 3303, and the like. A flexible substrate is used as a substrate in the display portion 3302, and a goggle type display is fabricated with the bent display portion 3302. In addition, a goggle type display, which is lightweight and thin, is achieved. A display device fabricated in the present invention is applied to the display portions 3302 and thereby a goggle type display of the present invention is achieved.

Figure 7E:
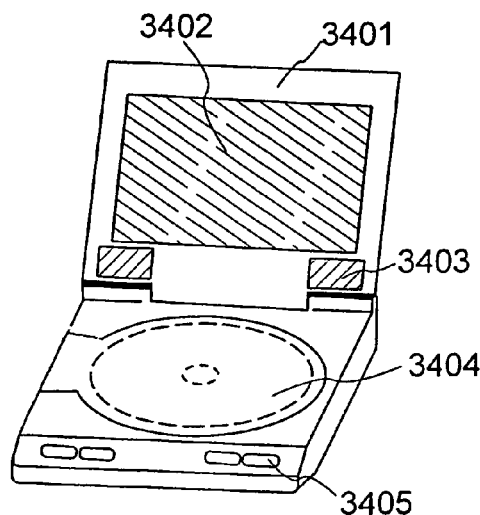

FIG. 7E is a player utilizing a recording medium that has a program recorded (hereinafter referred to as a recording medium) including a body 3401, a display portion 3402, a speaker portion 3403, a recording medium 3404, an operating switch 9705, and the like. It is noted that this player makes it possible to enjoy listening to the music, watching the movie, playing the game, and playing on the Internet using a DVD (Digital Versatile Disc), CD, or the like as the recording medium. A display device fabricated in the present invention is applied to the display portion 3402 and thereby a recording medium of the present invention is achieved.

Figure 7F:
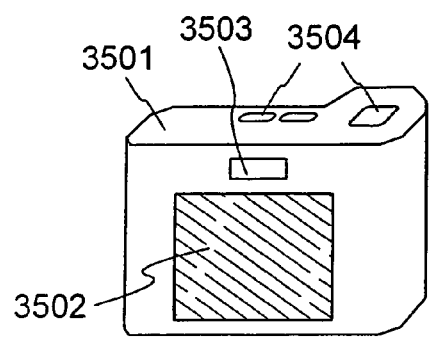

FIG. 7F is a digital camera including a body 3501, a display portion 3502, an eye piece 3503, operating switches 3504, an image receiving portion (not shown in the figure), and the like. A display device fabricated in the present invention is applied to the display portion 3502 and thereby a digital camera of the present invention is achieved.

Figure 8A:
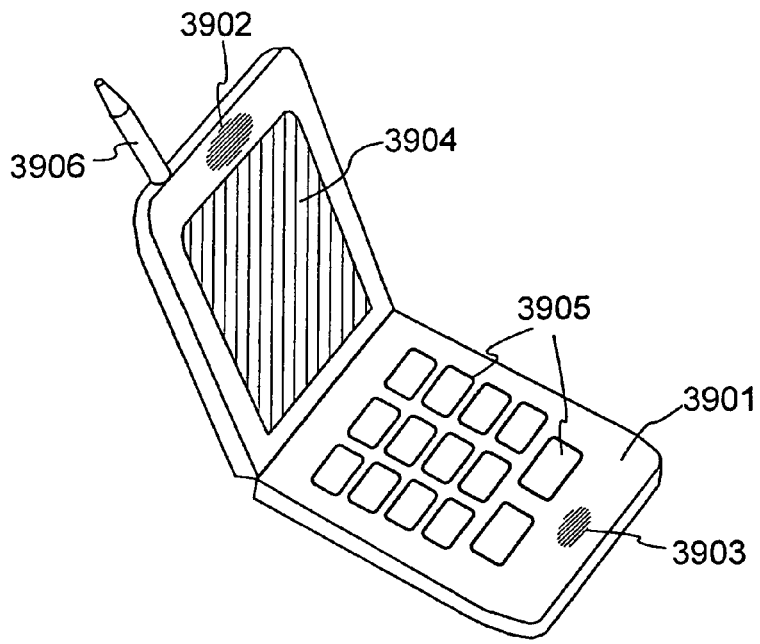
FIGS. 8A to 8C are views showing an example of display device of the present invention.

FIG. 8A is a cellular phone including a body 3901, a voice output portion 3902, a voice input portion 3903, a display portion 3904, operating switches 3905, an antenna 3906, and the like. A display device fabricated in the present invention is applied to the display portion 3904 and thereby a cellular phone of the present invention is achieved.

Figure 8B:
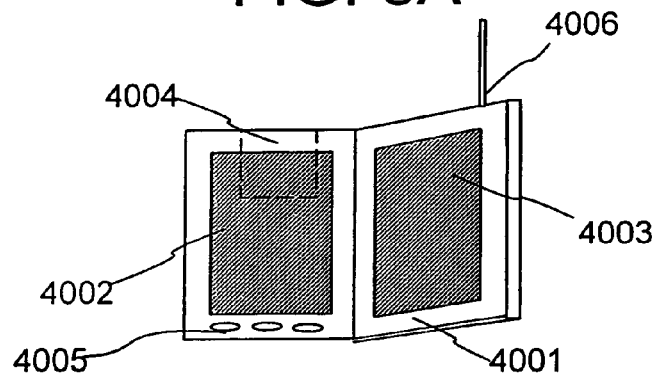

FIG. 8B is a mobile book (an electronic book) including a body 4001, display portions 4002 and 4003, a recording medium 4004, an operating switch 4005, and an antenna 4006, and the like. A display device fabricated in the present invention is applied to the display portions 4002 and 4003, and thereby a mobile book of the present invention is achieved.

Figure 8C:
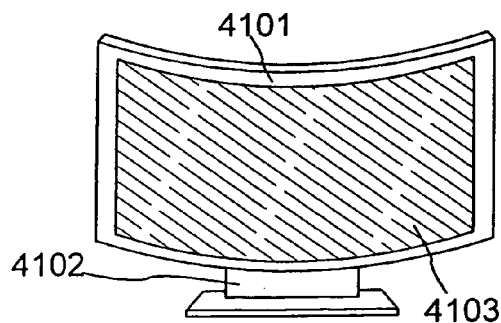

FIG. 8C is a display including a body 4101, a supporting stand 4102, a display portion 4103, and the like. A flexible substrate is used as a substrate in the display portion 4103 and the display, which is lightweight and thin, is achieved. In addition, the display can be fabricated with the bent display portion 4103. A display device fabricated in the present invention is applied to the display portion 4103 and thereby a display of the present invention is achieved.

As described above, the present invention can be applied to various kinds of devices, and can be applied to the electronics device in every field. Further, an electronic device described in this embodiment may use a light-emitting device having a structure shown in any one of Embodiments 1 to 3.

What is claimed is:

1. A doping method comprising:
    doping a dopant element providing one conductivity type to a semiconductor layer;
    dropping a liquid drop on the semiconductor layer;
    measuring a contact angle of the liquid drop on the semiconductor layer;
    obtaining information of a conductivity type and a carrier concentration of the semiconductor layer from the measured contact angle; and
    further doping a required amount of the dopant element to the semiconductor layer in accordance with the information of the conductivity type and the carrier concentration.

2. A method for fabricating a thin film transistor comprising:
    forming a conductive layer adjacent to a first semiconductor layer and a second semiconductor layer with a gate insulating film interposed therebetween;
    doping a dopant element providing one conductivity type to the first semiconductor layer and the second semiconductor layer;
    dropping a liquid drop on the second semiconductor layer;
    measuring a contact angle of the liquid drop on the second semiconductor layer;
    obtaining information of a conductivity type and a carrier concentration of the first semiconductor layer from the measured contact angle; and
    further doping a required amount of the dopant element to the first semiconductor layer in accordance with the information of the conductivity type and the carrier concentration.

3. A method for fabricating a thin film transistor comprising:
    forming a conductive layer adjacent to a first semiconductor layer and a second semiconductor layer with a gate insulating film interposed therebetween;
    doping a dopant element providing one conductivity type to the first semiconductor layer and the second semiconductor layer;
    exposing a surface of the second semiconductor layer by etching the gate insulating film;
    dropping a liquid drop on the surface of the second semiconductor layer;
    measuring a contact angle of the liquid drop on the surface of the second semiconductor layer;
    obtaining information of a conductivity type and a carrier concentration of the first semiconductor layer from the measured contact angle; and
    further doping a required amount of the dopant element to the first semiconductor layer in accordance with the information of the conductivity type and the carrier concentration.

4. The doping method according to claim 1, wherein the liquid drop comprises water.

5. The method for fabricating a thin film transistor according to claim 2, wherein the liquid drop comprises water.

6. The method for fabricating a thin film transistor according to claim 3, wherein the liquid drop comprises water.

7. The doping method according to claim 1, wherein the dopant element is phosphorous.

8. The method for fabricating a thin film transistor according to claim 2, wherein the dopant element is phosphorous.

9. The method for fabricating a thin film transistor according to claim 3, wherein the dopant element is phosphorous.

10. The doping method according to claim 1, wherein the dopant element is boron.

11. The method for fabricating a thin film transistor according to claim 2, wherein the dopant element is boron.

12. The method for fabricating a thin film transistor according to claim 3, wherein the dopant element is boron.

13. The method for fabricating a thin film transistor according to claim 3, wherein an oxide film formed on the surface of the second semiconductor layer is chemically removed.

14. The doping method according to claim 1, wherein the contact angle is measured via a camera.

15. The method for fabricating a thin film transistor according to claim 2, wherein the contact angle is measured via a camera.

16. The method for fabricating a thin film transistor according to claim 3, wherein the contact angle is measured via a camera.

17. The doping method according to claim 1, wherein the semiconductor layer is a semiconductor layer selected from the group consisting of an amorphous semiconductor layer, a microcrystalline semiconductor layer, and a crystalline semiconductor layer.

18. The method for fabricating a thin film transistor according to claim 2, wherein each of the first and second semiconductor layers is a semiconductor layer selected from the group consisting of an amorphous semiconductor layer, a microcrystalline semiconductor layer, and a crystalline semiconductor layer.

19. The method for fabricating a thin film transistor according to claim 3, wherein each of the first and second semiconductor layers is a semiconductor layer selected from the group consisting of an amorphous semiconductor layer, a microcrystalline semiconductor layer, and a crystalline semiconductor layer.

* * * * *